United States Patent [19]
Gaboury

[11] Patent Number: 5,481,717
[45] Date of Patent: Jan. 2, 1996

[54] LOGIC PROGRAM COMPARISON METHOD FOR VERIFYING A COMPUTER PROGRAM IN RELATION TO A SYSTEM SPECIFICATION

[75] Inventor: Pierre Gaboury, Yokohama, Japan

[73] Assignee: Kabushiki Kaisha Toshiba, Kawasaki, Japan

[21] Appl. No.: 229,427

[22] Filed: Apr. 12, 1994

[30] Foreign Application Priority Data

Apr. 12, 1993  [JP]  Japan ................................. 5-084450

[51] Int. Cl.$^6$ ........................................................ G06F 9/44
[52] U.S. Cl. ................................... 395/700; 364/DIG. 1; 364/280; 364/280.4
[58] Field of Search .................................... 395/700, 650

[56] References Cited

PUBLICATIONS

Computer Aided Verification, 3rd International Workshop CAV'91 Proceedings; pp. 466–476; "Comparing Generic State Machines"; M. Langevin, et al, 1991.
IEEE Transactions on Computer–Aided Design, v. 11, No. 12, pp. 1469–1478. "A Theory and Implementation of Sequential Hardware Equivalence"; Carl Pixley, 1992.
IMEC–IFIP International Workshop on Applied Formal Methods of Correct VLSI Design, pp. 111–128. "Verification of Sequential Machines Using Boolean Functional Vectors"; Olivier Coudert, et al, 1989.

*Primary Examiner*—Kevin A. Kriess
*Attorney, Agent, or Firm*—Oblon, Spivak, McClelland, Maier, & Neustadt

[57] ABSTRACT

It is an object of the present invention to provide a logic program comparison method which makes it possible to do verification by comparing parameterized logic programs and which increases the efficiency of the verification. The keyboard 1 and the input section 4 read two logic programs. The conversion section 5 converts the logic programs into the first and second finite state machine descriptions. The comparison section 6 determines whether there exists an equivalence between the states, between input values, and between output values of the first and second descriptions, and determines whether both descriptions produce respective outputs values deemed equal for all respective inputs deemed equal, for all respective states deemed equal. The result of the comparison is output through the output section 7 and the display unit 2.

7 Claims, 10 Drawing Sheets

1: ¬ stack([exec,nop,exec,exec],[push,push,pop,pop],[a,b,c,d], O, E, []).
2: stack([],[],[],[],[], U1) ← □
3: stack(Ctl|CS, [Mode|MS], [In|IS], [Out|OS], [Err|ES], Stack) ←
4:     stackBody(Ctl, Mode, In, Out, Err, Stack, NewStack),
5:     stack(CS, MS, IS, OS, ES, NewStack).
6: stackBody(nop, U2, U3, U4, ok, Stack, Stack) ← □.
7: stackBody(exec, push, V1, U5, ok, Stack, [V1|Stack]) ← □.
8: stackBody(exec, pop, U6, V2, ok, [V2|Stack], Stack) ← □.
9: stackBody(exec, pop, U7, U8, error, [],[]) ← □.

*FIG. 2*

1: ¬ listOfCtl(C), listOfMode(M), list(I), list(Stack), stack(C,M,I,O,E,Stack).
2: ctl(nop) ← □.
3: ctl(exec) ← □.
4: mode(pop) ← □.
5: mode(push) ← □.
6: listOfCtl([]) ← □.
7: listOfCtl([E|L]) ←
8:     ctl(E),
9:     listOfCtl(L).
10: listOfMode([]) ← □.
11: listOfMode([E|L]) ←
12:     mode(E),
13:     listOfMode(L).
14: list([]) ← □.
15: list([E|L]) ←
16:     list(L).

*FIG. 3*

1: $T_1 = \{\text{exec, nop}\}$
2: $T_2 = \{\text{pop, push}\}$
3: $T_3 = \{\text{error, ok}\}$
4: $T_4 = \{[], [T_1|T_4]\}$
5: $T_5 = \{[], [T_2|T_5]\}$
6: $T_6 = \{[], [T_3|T_6]\}$
7: $T_7 = \{[], [\Phi|T_7]\}$

*FIG. 4*

1: $\neg \text{listOfCtl}(\Phi), \text{listOfMode}(\Phi), \text{list}(\Phi), \text{list}(\Phi), \text{stack}(T_4, T_5, T_7, \Phi, \Phi, T_7)$
2: $\text{stack}([],[],[],[],[],T_7) \leftarrow \square.$
3: $\text{stack}([T_1|T_4], [T_2|T_5], [\Phi|T_7], [\Phi|T_7], [\Phi|T_7], T_7) \leftarrow$
4: $\quad \text{stackBody}(T_1, T_2, \Phi, \Phi, \Phi, T_7, T_7),$
5: $\quad \text{stack}(T_4, T_5, T_7, \Phi, \Phi, T_7).$
6: $\text{stackBody}(\text{nop}, \Phi, \Phi, \Phi, \text{ok}, T_7, T_7) \leftarrow \square.$
7: $\text{stackBody}(\text{exec, push}, \Phi, \Phi, \text{ok}, T_7, [\Phi|T_7]) \leftarrow \square.$
8: $\text{stackBody}(\text{exec, pop}, \Phi, \Phi, \text{ok}, [\Phi|T_7], T_7) \leftarrow \square.$
9: $\text{stackBody}(\text{exec, pop}, \Phi, \Phi, \text{error}, [], []) \leftarrow \square.$

*FIG. 5*

1: $\neg \text{listOfCtl}(T_4), \text{listOfMode}(T_5), \text{list}(T_7), \text{list}(T_7), \text{stack}(T_4, T_5, T_7, T_7, T_6, T_7).$
2: $\text{stack}([],[],[],[],[],T_7) \leftarrow \square.$
3: $\text{stack}([T_1|T_4], [T_2|T_5], [\Phi|T_7], [\Phi|T_7], [T_3|T_6], T_7) \leftarrow$
4: $\quad \text{stackBody}(T_1, T_2, \Phi, \Phi, T_3, T_7, T_7),$
5: $\quad \text{stack}(T_4, T_5, T_7, T_7, T_6, T_7).$
6: $\text{stackBody}(\text{nop}, \Phi, \Phi, \Phi, \text{ok}, T_7, T_7) \leftarrow \square.$
7: $\text{stackBody}(\text{exec, push}, \Phi, \Phi, \text{ok}, T_7, [\Phi|T_7]) \leftarrow \square.$
8: $\text{stackBody}(\text{exec, pop}, \Phi, \Phi, \text{ok}, [\Phi|T_7], T_7) \leftarrow \square.$
9: $\text{stackBody}(\text{exec, pop}, \Phi, \Phi, \text{error}, [], []) \leftarrow \square.$

1: stack(A1, A2, A3, A4, A5, A6) ←
2:    A1 = [], A2 = [], A3 = [], A4 = [], A5 = [], A6 = U1 ∨
3:    A1 = [Ctl|CS], A2 = [Mode|MS], A3 = [In|IS], A4 = [Out|OS],
4:       A5 = [Err|ES], A6 = Stack,
5:       stackBody(Ctl, Mode, In, Out, Err, Stack, NewStack),
6:       stack(CS, MS, IS, OS, ES, NewStack).
7: stackBody(A1, A2, A3, A4, A5, A6, A7) ←
8:    A1 = nop, A2 = U2, A3 = U3, A4 = U4, A5 = ok, A6 = Stack, A7 = Stack ∨
9:    A1 = exec, A2 = push, A3 = V1, A4 = U5, A5 = ok, A6 = Stack, A7 = [V1|Stack] ∨
10:   A1 = exec, A2 = pop, A3 = U6, A4 = V2, A5 = ok, A6 = [V2|Stack], A7 = Stack ∨
11:   A1 = exec, A2 = pop, A3 = U7, A4 = U8, A5 = error, A6 = [], A7 = [].

FIG. 8

1: ¬stack( [exec, nop, exec, exec], [push, push, pop, pop], [a, b, c, d], O, E, [] ).
2: stack( [], [], [], [], [], U1 ) ← □.
3: stack( [Ctl|CS], [Mode|MS], [In|IS], [Out|OS], [Err|ES], Stack ) ←
4:     stackBody( Ctl, Mode, In, Out, Err, Stack, NewStack ),
5:     stack( CS, MS, IS, OS, ES, NewStack ).
6:
7: stackBody( nop, U2, U3, U4, ok, Stack, Stack ) ← □.
8: stackBody( exec, push, V1, U5, ok, Stack, [V1|Stack] ) ←
9:     len( Stack, N ),
10:    N < 3
11: stackBody( exec, push, V1, U6, error, Stack, Stack ) ←
12:    len( Stack, 3 ).
13: stackBody( exec, pop, U7, V2, ok, [V2|Stack], Stack ) ← □.
14: stackBody( exec, pop, U8, U9, error, [], [] ) ← □.
15:
16: len( [], 0 ) ← □.
17: len( [A|B], N ) ← len( B, N1 ), N is N1 + 1.

*FIG. 9*

1: stack( A1, A2, A3, A4, A5, A6 ) ←
2:    A1 = [], A2 = [], A3 = [], A4 = [], A5 = [], A6 = U1 ∨
3:    A1 = [Ctl|CS], A2 = [Mode|MS], A3 = [In|IS], A4 = [Out|OS],
4:        A5 = [Err|ES], A6 = Stack,
5:        stackBody( Ctl, Mode, In, Out, Err, Stack, NewStack ),
6:        stack( CS, MS, IS, OS, ES, NewStack ).
7: stackBody( A1, A2, A3, A4, A5, A6, A7 ) ←
8:    A1 = nop, A2 = U2  A3 = U3, A4 = U4, A5 = ok, A6 = Stack, A7 = Stack ∨
9:    A1 = exec, A2 = push, A3 = V1, A4 = U5, A5 = ok, A6 = Stack, A7 = [V1|Stack],
10:       len( Stack, N ),  N < 3 ∨
11:   A1 = exec, A2 = push, A3 = V2, A4 = U6, A5 = error, A6 = Stack, A7 = Stack,
12:       len( Stack, 3 ) ∨
13:   A1 = exec, A2 = pop, A3 = U7, A4 = V3, A5 = ok, A6 = [V3|Stack], A7 = Stack ∨
14:   A1 = exec, A2 = pop, A3 = U8, A4 = U9, A5 = error, A6 = [], A7 = [].

*FIG. 10*

1: stack $(A1, A2, A3, A4, A5, A6,)$ ←
2:     $A1 = [\,], A2 = [\,], A3 = [\,], A4 = [\,], A5 = [\,], A6 = U1$ ∨
3:     $A1 = [Ctl|CS], A2 = [Mode|MS], A3 = [In|IS], A4 = [Out|OS],$
4:       $A5 = [Err|ES], A6 = Stack,$
5:       $Ctl = $ nop, $Mode = U2, In = U3, Out = U4, Err = $ ok,
6:         $Stack = Stack1, NewStack = Stack1$ ∨
7:       $Ctl = $ exec, $Mode = $ push, $In = V1, Out = U5, Err = $ ok,
8:         $Stack = [\,], NewStack = [V1]$ ∨
9:       $Ctl = $ exec, $Mode = $ push, $In = V2, Out = U6, Err = $ ok,
10:        $Stack = [A1], NewStack = [V2, A1]$ ∨
11:      $Ctl = $ exec, $Mode = $ push, $In = V3, Out = U7, Err = $ ok,
12:        $Stack = [B1, B2], NewStack = [V3, B1, B2]$ ∨
13:      $Ctl = $ exec, $Mode = $ push, $In = V4, Out = U8, Err = $ error,
14:        $Stack = [C1, C2, C3], NewStack = [C1, C2, C3]$ ∨
15:      $Ctl = $ exec, $Mode = $ pop, $In = U9, Out = V5, Err = $ ok,
16:        $Stack = [V5|Stack1], NewStack = Stack1$ ∨
17:      $Ctl = $ exec, $Mode = $ pop, $In = U10, Out = U11, Err = $ error,
18:        $Stack = [\,], NewStack = [\,],$
19:     stack $(CS, MS, IS, OS, ES, NewStack).$

*FIG. 11*

1: spec(*Ctl, Mode, In, Out, Err, Stack, NewStack*) ←

2:     *Ctl* = nop, *Mode* = U1, *In* = U2, *Out* = U3, *Err* = ok, 3:         *Stack* = Stack1, *NewStack* = Stack1 ∨

4:     *Ctl* = exec, *Mode* = push, *In* = V1, *Out* = U1, *Err* = ok, 5:         *Stack* = [], *NewStack* = [V1] ∨

6:     *Ctl* = exec, *Mode* = push, *In* = V1, *Out* = U1, *Err* = ok, 7:         *Stack* = [X1], *NewStack* = [V1, X1] ∨

8:     *Ctl* = exec, *Mode* = push, *In* = V1, *Out* = U1, *Err* = ok, 9:         *Stack* = [X1, X2], *NewStack* = [V1, X1, X2] ∨

10:    *Ctl* = exec, *Mode* = push, *In* = V1, *Out* = U1, *Err* = error, 11:        *Stack* = [X1, X2, X3], *NewStack* = [X1, X2, X3] ∨

12:    *Ctl* = exec, *Mode* = pop, *In* = U1, *Out* = V2, *Err* = ok, 13:        *Stack* = [V2 | Stack1], *NewStack* = Stack1 ∨

14:    *Ctl* = exec, *Mode* = pop, *In* = U1, *Out* = V2, *Err* = error, 15:        *Stack* = [], *NewStack* = [].

```
1:  spec (Ctl, Mode, In, Out, Err, Stack, NewStack) ←
2:      Ctl = nop,
3:          (Out = U3, Err = ok, NewStack = Stack) ∨
4:      Ctl = exec,
5:          (Mode = push,
6:              (Stack = [],
7:                  Out = U1, Err = ok, NewStack = [In] ∨
8:              Stack = [A1],
9:                  Out = U2, Err = ok, NewStack = [In, A1] ∨
10:             Stack = [B1, B2],
11:                 Out = U3, Err = ok, NewStack = [In, B1, B2] ∨
12:             Stack = [C1, C2, C3],
13:                 Out = U4, Err = error, NewStack = [C1, C2, C3] ∨
14:         (Mode = pop,
15:             Stack = [V5|Stack1],
16:                 (Out = V5, Err = ok, NewStack = Stack1) ∨
17:             Stack = [],
18:                 (Out = U5, Err = error, NewStack = []) )).
```

FIG. 14

1: spec(*Ctl, Mode, In, Out, Err, Stack, NewStack*) ←
2:    *Ctl* = nop,
3:       (*Out* = U3, *Err* = ok, *NewStack* = *Stack*) ∨
4:    *Ctl* = exec,
5:       (*Mode* = push,
6:          *Stack* = [],
7:             *Out* = U1, *Err* = ok, *NewStack* = [*In*] ∨
8:          *Stack* = [A1],
9:             *Out* = U2, *Err* = ok, *NewStack* = [*In*, A1] ∨
10:         *Stack* = [B1, B2],
11:            *Out* = U3, *Err* = ok, *NewStack* = [*In*, B1, B2] ∨
12:         *Stack* = [C1, C2, C3],
13:            *Out* = U4, *Err* = error, *NewStack* = [C1, C2, C3]) ∨
14:      (*Mode* = pop,
15:         *Stack* = [V5],
16:            (*Out* = V5, *Err* = ok, *NewStack* = []) ∨
17:         *Stack* = [V6, D1],
18:            (*Out* = V6, *Err* = ok, *NewStack* = [D1]) ∨
19:         *Stack* = [V7, E1, E2],
20:            (*Out* = V7, *Err* = ok, *NewStack* = [E1, E2]) ∨
21:         *Stack* = [],
22:            (*Out* = U5, *Err* = error, *NewStack* = []) )).

*FIG. 15*

1: spec(*Ctl, Mode, In, Out, Err, Stack, NewStack*) ←

2:     *Ctl* = nop,

3:         (*Out* = *U3*, *Err* = ok, *NewStack* = *Stack*) ∨

4:     *Ctl* = exec,

5:         (*Mode* = push,

6:             *Stack* = 0:[*F1, F2, F3*], 7:                 *Out* = *U1*, *Err* = ok, *NewStack* = 1:[*In, F4, F5*] ∨

8:             *Stack* = 1:[*A1, F6, F7*], 9:                 *Out* = *U2*, *Err* = ok, *NewStack* = 2:[*In, A1, F8*] ∨

10:            *Stack* = 2:[*B1, B2, F9*], 11:                *Out* = *U3*, *Err* = ok, *NewStack* = 3:[*In, B1, B2*] ∨

12:            *Stack* = 3:[*C1, C2, C3*], 13:                *Out* = *U4*, *Err* = error, *NewStack* = 3:[*C1, C2, C3*]) ∨

14:         (*Mode* = pop,

15:             *Stack* = 1:[*V5, F10, F11*], 16:                (*Out* = *V5*, *Err* = ok, *NewStack* = 0:[*F12, F13, F14*]) ∨

17:             *Stack* = 2:[*V6, D1, F15*], 18:                (*Out* = *V6*, *Err* = ok, *NewStack* = 1:[*D1, F16, F17*]) ∨

19:             *Stack* = 3:[*V7, E1, E2*], 20:                (*Out* = *V7*, *Err* = ok, *NewStack* = 2:[*E1, E2, F18*]) ∨

21:             *Stack* = 0:[*F19, F20, F21*], 22:                (*Out* = *U5*, *Err* = error, *NewStack* = 0:[*F22, F23, F24*]) ))

*FIG. 16*

LOGIC PROGRAM COMPARISON METHOD FOR VERIFYING A COMPUTER PROGRAM IN RELATION TO A SYSTEM SPECIFICATION

BACKGROUND OF THE INVENTION

The invention relates to a process for verifying the correctness of an implementation by comparing it with a system specification on which the implementation is based, each represented by logic programs.

To build a system, such as a computer system which consists of hardware and software, the specifications are first prepared and, based on them, an actual system is implemented. The specifications, which describe what a designer wishes the implementation to satisfy, are generally written in a style that is unambiguous yet easy to read. On the other hand, the implementation, which describe software and hardware which embody the specifications, is written in a style which permits the details of how a software and hardware component will solve a given problem.

Verification means the analysis of the implementation to determine whether all parts of the specifications are satisfied by the implementation. Verification is vital in building an error-free system according to the designer's intents.

During development of system hardware or software, it is desirable to determine whether the implementation meets all parts of the specifications. Verification during development significantly enhances system reliability and eliminates the need for backtrack processes during development.

The implementation that satisfies all the conditions expressed in the specification is said to satisfy the specification. As a system becomes larger and more complicated, it is very important, during system development, to ensure that the specification is satisfied.

There are several description formats for the specification, and the designer uses one of the formats depending upon the types of conditions to be verified. For asynchronous systems such as communication protocols, a specification format in which conditions are represented based on the timing of events is desirable. A specification description language for this purpose, such as temporal logic, is available. For synchronous systems containing many hardware units, it is desirable that specifications express conditions concerning functionality in terms of the relationship between the input and output of hardware and software components. The present invention relates to the latter type of input-output correctness verification.

There is a method for verifying the output correctness of an implementation with respect to a specification. In this method, both the implementation and the specification are translated to finite state machine (FSM) representations (hereafter called FSM) and then these two FSM representations are compared. The FSM representation eliminates syntactic differences (such as variable names) between the specification and the implementation, and provides a common representation of the semantic content of the specification and the implementation, facilitating comparison.

The FSM itself can be represented using boolean expressions. Since the FSMs are often very large, the boolean expressions can in turn be represented using binary decision diagrams (BDDs).

Not only are BDDs able to represent the internal contents of FSMs, but a set of algorithms exist which allow fast processing of large boolean expressions.

To make the comparison of two FSMs meaningful, it is usually assumed that both FSMs accept the same set of possible input values.

When two FSMs are compared, it is required that, in each FSM state, both machines will generate the same outputs for identical inputs. The two machines start in their respective initial states. That is, the current state of each machine is assumed to be the initial state. And, for the current state, a check is made to ensure that the corresponding outputs of the two machines are identical for all possible input values. This process is repeated for all the possible states. When the check is made for all the possible states, the identity of two FSMs can be determined.

Using a BDD based comparison of FSMs results in extremely short computer execution time. However, the BDD representation used in this method has limited expressiveness, and unable to take direct advantage of patterns in the state space. This means that the compactness of BDD representation depends on the ability to find patterns in the boolean expressions. In addition, the efficiency of BDD representations are largely affected by the order of the variables occurring in the boolean expressions, yet it is extremely difficult to determine the order of variables. Because of this, it is difficult to do effective verification in the existing FSM based method.

Another drawback of existing FSM based verification methods is that only strictly finite state machines can be compared. In the verification of an actual system, it is often desirable to work with parameterized specifications and implementation descriptions. In that case, however, existing methods are not efficient because some elements of the system are left as unspecified variables. For example, when comparing a stack implementation description against a stack specification, the details of the stack contents are left as unspecified parameters. Existing methods do not handle this case.

In view of the foregoing, it is the main object of the present invention to provide a method to solve the problem of the prior art. More specifically, it is an object of this invention to provide a method whereby verification is performed with parameterized logic programs and to provide an efficient logic program comparison method.

SUMMARY OF THE INVENTION

The present invention has the following effects: Two logic programs entered by the input step are converted to the first and second FSM descriptions by a converting step. The converting step determines the data types of each program, converts each program to the completed form, expands the procedure calls in each program to procedure bodies, permutes the resulting procedure dies based on the variable order, and replaces each representation in the program by a unique code. Thus, canonical FSMs which are suitable for verification may be obtained, making comparison between FSMs easy. Then, the comparison step determines whether there exists an equivalence between enumerated states, between input values, and between output values, and determines whether the descriptions produce respective output values deemed equal for all respective inputs deemed equal for all respective states deemed equal, and outputs the result of the comparison. Thus, the equality relation need not be strict equality but need only satisfy a given relation, making it possible to verify parameterized logic programs.

According to the invention the converted contents to be compared are restricted to generic queries, making the comparison more efficient.

According to the invention the data types are determined by applying static analysis to each program, eliminating the need for the user to determine the data types of the program.

According to the invention as, the comparison step performs comparison with a constraint solver. The constraint solver: associates a unique constraint variable with each term denoting an input, output, or state; generates a conjunction of inequalities between each pair of constraint variables; generates equalities between constraint variables occurring in the same respective positions of the expressions for all possible reorderings of the disjunctions such that one description is equal to the other description; and, performs comparison with the conjunction of inequalities and disjunction of the conjunctions of equalities as the constraints. Therefore, according to the invention, it is possible to compare FSMs each having its own internal representation.

In the drawings, 1 is Keyboard, 2 is Display unit, 3 is I/O control circuit, 4 is Input section, 5 is Conversion section, 6 is Comparison section, 7 is Output section.

DETAILED DESCRIPTION

The logic program comparator (hereafter called comparator) as illustrated in the figures will be explained in more detail. The comparator is the preferred embodiment of the invention. The comparator is implemented on a computer, and each function is performed by executing the programmed procedures on the computer. Thus, in the following discussion, each virtual circuit block is associated with a function of the comparator.

Figure 1:
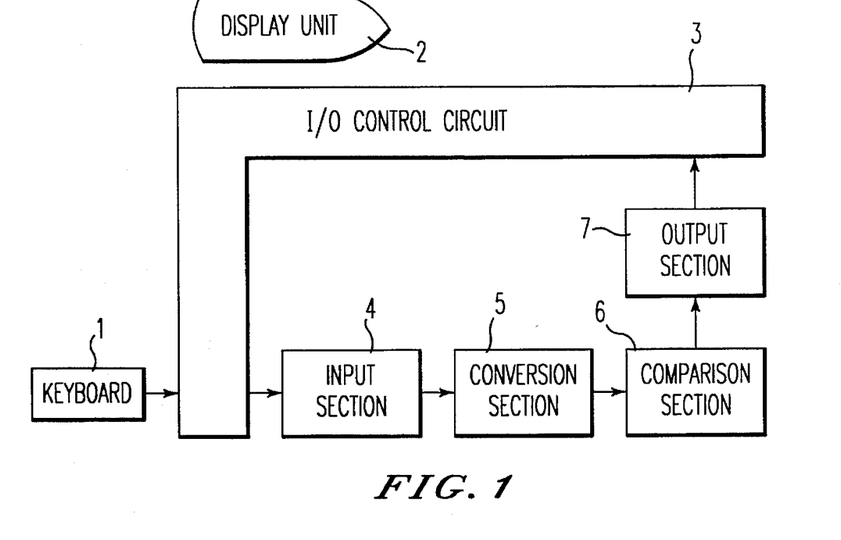
FIG. 1 is a block diagram showing a logic program comparator method of the preferred embodiment of this invention.

1. Structure of preferred embodiment ... FIG. 1

As shown in FIG. 1 (block diagram of the comparator), the comparator has a keyboard 1, display unit 2, I/O control circuit 3, and an input section 4 which controls the input operation of logic programs through the keyboard 1. The comparator also has a conversion section 5 (corresponding to the conversion step) which converts each logic program to an FSM, a comparison section 6 (corresponding to the comparison step) which compares two FSMs, and an output section 7 which controls the output operation of comparison results to the display unit 2. The keyboard 1, I/O control circuit 3, and input section 4 comprise the input method, while the output section 7, I/O control circuit 3, and display unit 2 comprise the output method.

2. Operation of preferred embodiment ... FIGS. 2–17

The comparator which has the component as described above compares logic programs as follows:

2-1. Input of logic programs

First, the user enters logic programs, which describe the system specification and the implementation, into the comparator from the keyboard 1. In general, a logic program is described in a logic programming language, which is based on logic language systems such as predicate logic. The logic programming language used in the preferred embodiment is based on the following predicate logic:

2-1-1. Predicate logic

The predicate logic is defined over a universe of terms. For example, a term t in the universe is either a variable V, a 0-ary function symbol f (hereafter called a constant), or it is a recursively constructed term $f(t_1, \ldots, t_n)$, $n>0$, where f is an n-ary function symbol, and $t_1, \ldots, t_n$ are terms in the universe. The terms are used to denote objects of the real world. For example, the constant "0" may be used to denote the integer zero, or the binary function symbol "node" may be used to denote a node in a binary tree such that node $(t_1, t_2)$ denotes a node with left child $t_1$ and right child $t_2$.

Atomic formulae denote relations over the universe of terms. That is, an atomic formula is an n-ary predicate symbol p, along with n arguments. If n=0, then the atomic formula is called a proposition, and is written p; otherwise, the atomic formula is written $p(t_1, \ldots, t_n)$, where $t_1, \ldots, t_n$ are terms. In predicate logic, a literal is defined as being either an atomic formula A or the negation of an atomic formula shown below.

<Formula 1>

$\neg A$.

Formulae in predicate logic are constructed using the following logical connectives:

<Formula 2>

$\neg, \wedge, \vee, \leftarrow, \exists, \forall$

The above logical connectives denote negation, conjunction, disjunction, implication, existential quantification, and universal quantification, respectively. For example, if A is a literal, V is a variable, and $F_1$ and $F_2$ are formulae, then the following are also formulae:

<Formula 3>

$\neg, F_1, F_1 \wedge F_2, F_1 \vee F_2, F_1 \leftarrow F_2, \exists V.F_2, \forall V.F_2$ A clause is a formula restricted to a certain, usually simple, form. A sentence used in predicate logic is defined as a set of clauses, and is interpreted as the conjunction of its clauses.

2-1-2. Logic programming language

The logic programming language used in the preferred embodiment is a variation of Prolog. It is a subset of the logic language described above for which there exists an efficient procedure for solving problems expressed in the subset. The subset of predicate logic is known as definite clauses. A definite clause is a formula restricted to one of the following three forms:

<Formula 4>

1. $\forall V_1, \ldots, V_n(H \leftarrow B)$
2. $\forall V_1, \ldots, V_n \neg B)$
3. $\forall V_1, \ldots, V_n(H \leftarrow \Box)$ where, H is an atomic formula, B is a (non-empty) conjunction of literals, $\Box$ represents the truth predicate (i.e., a relation that is always true), and $V_1, \ldots, V_n$ are the variables occurring in H and B. The first form in the above formula 4 is called a query, the second form is called a rule, and the third form is called a fact.

A logic program in this preferred embodiment is a sentence formed from a set of definite clauses. In the logic program, a query represents a task to be solved by the program. The task consists of proving that the following formula is false:

<Formula 5>

$\neg B$

That is, there exists an assignment to the variables in B such that B is true.

In the remainder of this document, the above logic programming language is assumed, and a notation closer to the syntax used in Prolog is adopted for logic programs. That is, the conjunction connective is written with a comma, the disjunction and universal quantifier symbols are omitted, and a period is used to indicate the end of a clause. Variable names will begin with a capital letter, and predicate symbols and function symbols will begin with a lower-case letter or a numeric digit. In addition, the following convenient notation will be used:

<Formula 6>

[]

Figure 2:
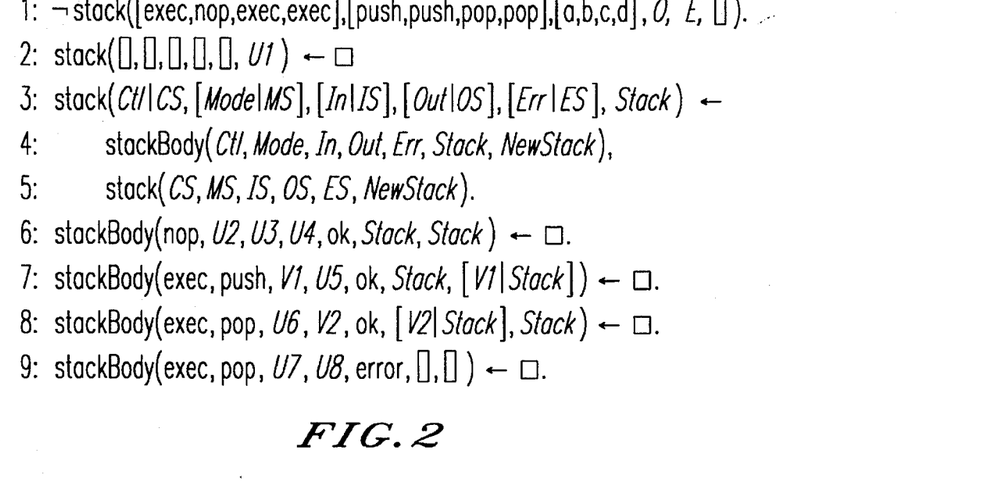
FIG. 2 is an example of a logic program describing the stack operation in the preferred embodiment of this invention.

The above notation denotes the empty list, $[t_1|t_2]$ denotes a list in which the head element of the list is the term $t_1$ and the tail of the list is $t_2$, and $[t_1, \ldots, t_n]$ denotes the list of terms $t_1, \ldots, t_n$. FIG. 2 shows an example of a query, and a simple logic program which defines the operation of a stack. In this figure, the query is shown on line 1, and lines 2 to 5 define the relation denoted by the predicate symbol "stack". The definition is recursive, and represents the activity of iterating through lists of values given in arguments 1 through 5 until the simultaneous ends of the lists. Each iteration through the list represents a single hardware clock cycle. The sixth argument of predicate symbol "stack" denotes the stack of values.

Lines 6 to 9 are facts which define the predicate symbol "stack body". The first 5 arguments of predicate symbol "stack" are lists which are used to denote a stream of values transmitted to or from the stack. The relation represented by the predicate symbol "stack body" denotes the manipulation of the stack. The constant "nop" denotes an idle cycle, and "exec" denotes an execution cycle. The constants "push" and "pop" represent commands that initiate pushing an element onto or popping an element from the stack respectively.

The constants "ok" and "error" are used to signal whether the operation was valid or invalid. In addition, argument three of predicate symbol "stack body" denotes the element to be pushed on the stack during a push operation (line 7), while argument four denotes the element popped during a successful pop operation (line 8). Argument six denotes the stack prior to an operation, and argument seven denotes the stack resulting from the execution of the operation.

The query (line 1) represents the problem statement of the problem to be solved by the logic program. More specifically, the statement determines values for "O" and "E" such that the atomic formula in the query is true. For this example, there are an infinite number of possible answers to the query: "O" can take on the value $[t_1, t_2, a, t_3]$ and "E" can take on the value [ok, ok, ok, error], where $t_1$, $t_2$, and $t_3$ are arbitrary terms.

2-1-3. Solution of a query

Solving a query is accomplished by viewing atomic formulae to the right of the←connective(arrow) as procedure calls. The set of clauses which have the same predicate symbol and arity in the atomic formula on the left hand side of the←connective correspond to procedure definitions. From the initial query Q, an atomic formula A (where $A \neq \Box$) is selected and removed, leaving the remainder Q'. The call A is then compared against the left hand atomic formula of the clauses in the conjunction for the corresponding procedure until a match is found. Two atomic formulae are said to match if there exists a substitution for the variables in both atomic formulae such that they become equal. This type of procedure whereby a match is found is called matching.

Suppose $A_1 \leftarrow B$ is a clause where $A_1$ matches A with a set of variable substitutions $\theta$. The query Q can be solved if the result of applying the substitution $\theta$ to the following is treated as a new query to which the matching process is recursively applied:

<Formula 7>

$Q' \wedge B$

The process terminates when an intermediate query consisting of only $\Box$ reached. The answer to the query is determined by applying all the substitutions to the initial query Q.

If during solving intermediate queries, there is no clause that matches the selected query and no solution is found, then backtracking is initiated. Backtracking allows other untried clauses to be searched for a solution. Prior to searching another clause, all variable substitutions created during the failed search must be removed.

The initial query is intended as a means for requesting from the logic program solving system answers to specific questions (e.g. the query of FIG. 2 is a request for values of the output signal O and the error signal E that satisfy the query). The purpose of the verification procedure described herein is to determine whether two logic programs (i.e., specification and implementation) will provide the same answers for all possible queries.

There may be a very wide variety of possible queries, but only a small subset are of any interest. For the description of a hardware stack shown in FIG. 2, for example, it would be unnecessary for the specification description, although possible arithmetically, that the stack "work in reverse", where values for the output and error signals would be supplied, generating the remaining input signals, control, and mode.

The specification language allows a higher level of abstraction compared to existing approaches, since it is possible to express polymorphism directly.

2-1-4. Generic Query

The verification time can be significantly reduced if the two logic programs are compared with respect to a small let set of queries that are expected to be found in actual operation. This reduced set of queries is represented by a generic query. The generic query is composed of two parts: the environment declaration portion, and the interface. The interface defines the input and output external interface ports of the component to be verified. Verification of correctness is done with respect to behavior visible at the interface, such that the details of the internal construction are unimportant. The environment declaration portion specifies the set of possible values that may appear at the inputs of the component to be verified during normal operation.

Figure 3:
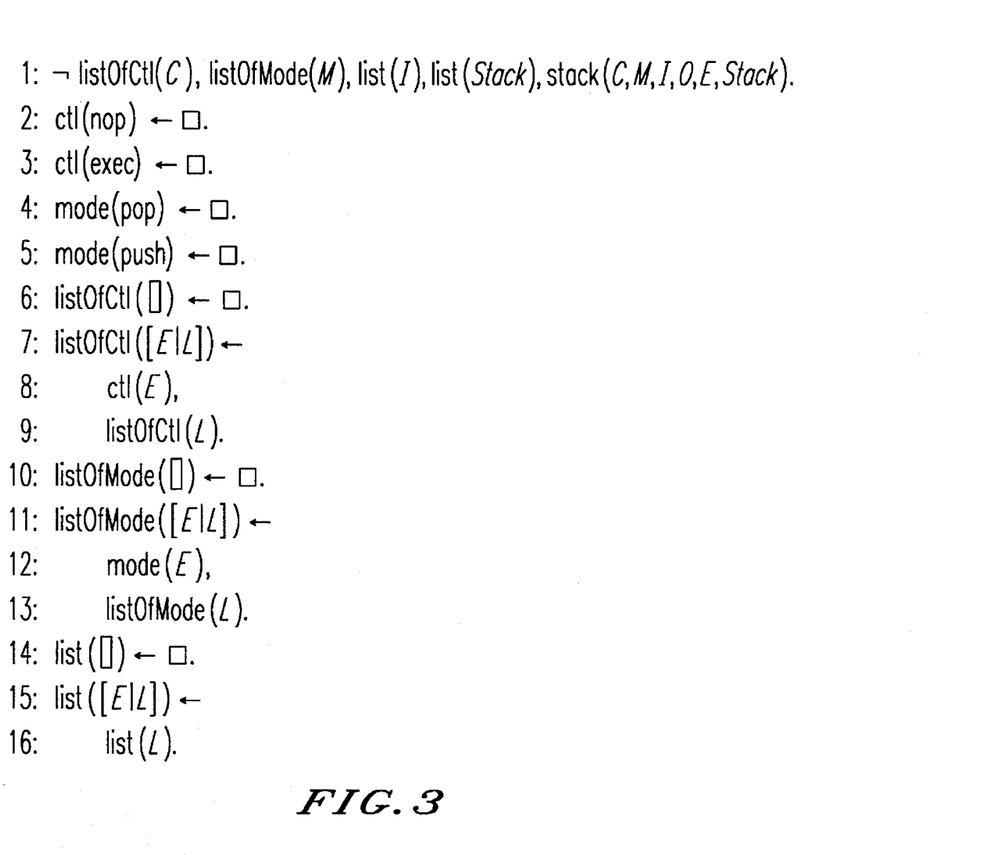
FIG. 3 shows the contents of the generic queries used in the preferred embodiment.

FIG. 3 shows a generic query (line 1), along with some additional clauses needed to help define the environment. The first four atoms (description unit) form the environment declaration portion of the generic query. These atoms define the types of values the inputs to the stack may have during execution. The fifth atom of the generic query defines the interface, which in this example consists of the interface to the stack.

2-2. Conversion of Logic Programs to FSMs 2-2-1. Determination of Data Types through Static Analysis The entered logic programs are sent to the conversion section 5 and, via static analysis, the data types of variables during logic program execution are determined. (Reference: Maurice Bruynooghe and Gerda Janssens. An instance of abstract interpretation integrating type and mode inferencing. In The MIT Press, editor, Logic Programming: Fifth International Conference and Symposium, pp. 669–683. IEEE, August 1988). That is, static analysis can provide information useful for various kinds of optimization. Therefore, static analysis is used in the preferred embodiment, rather than requiring the user to supply the necessary information.

For logic programs, types are descriptions of the set of possible terms that variables can take on as values during any execution. Types are defined by a set of rules of the form $\tau \rightarrow \{u_1, \ldots, u_n\}$, where $\tau$ is a type variable which denotes a type, and $u_1, \ldots, u_n$ are type terms. Type terms are constructed in the same way as regular logical terms, except that the variables are type variables instead of regular logical variables. The special type $\Phi$ represents the set of all possible terms. In this case, the following relation exists for any data type $\tau$:

<Formula 8>

$$\tau \subset \Phi$$

Figure 4:
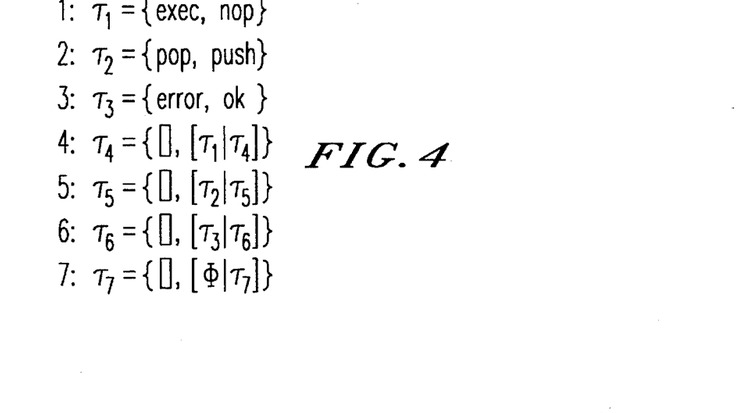
FIG. 4 shows the set of data type rules derived from the program shown in FIG. 2 within the operating environment shown in FIG. 3.
Figure 5:
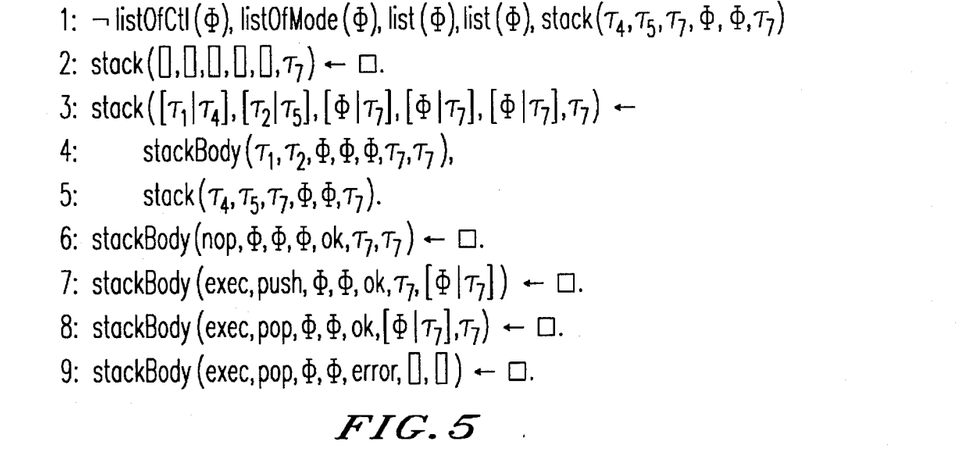
FIG. 5 shows the data types of the variables upon procedure call entry of the program shown in FIG. 2.
Figure 6:
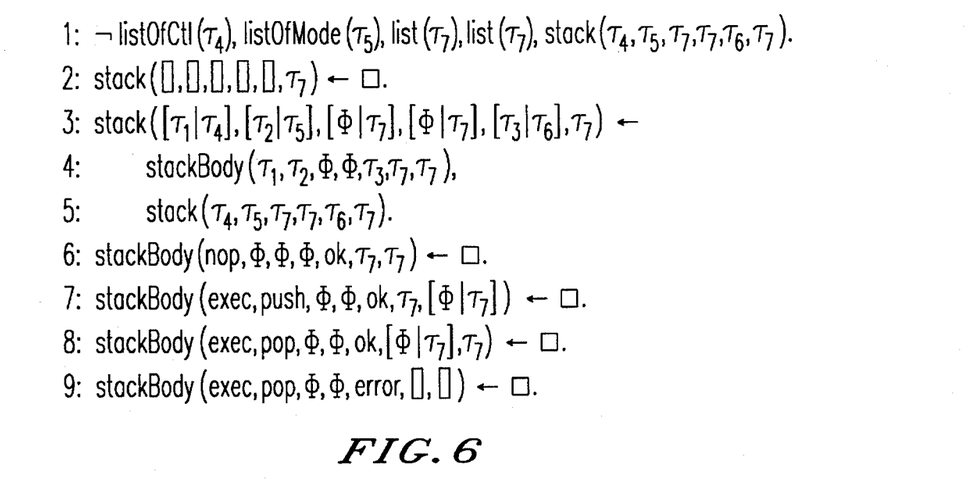
FIG. 6 shows data the types of the variables upon procedure call exit of the program shown in FIG. 2.

Applying static analysis to the generic query of FIG. 3 results in the set of type rules shown in FIG. 4. The types of the variables during execution are shown in FIGS. 5 and 6. The types at procedure entry are shown in FIG. 5, while those at procedure exit are shown in FIG. 6. The types of those calls within the environment declaration portion of the generic query are ignored and are not referenced. The above analysis results are used in converting the logic programs to FSMs.

2-2-2. FSM

Figure 7:
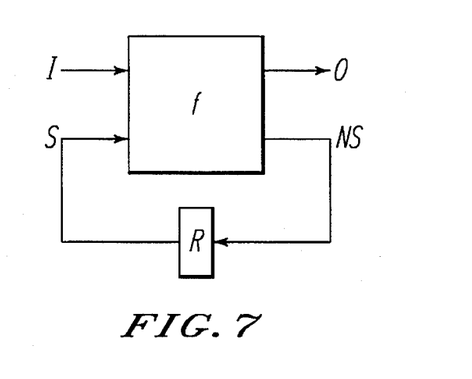
FIG. 7 is a block diagram showing the major components of a finite state machine.

Then, the logic programs are converted to canonical FSM representations for comparison (comparison base). FIG. 7 shows the overall structure of an FSM: input ports I, output ports O, transition function f, and state register R. In the FSM, the transition function f takes the current state S, and the current input at the input port I, and computes the output at O and the next state NS. The state register R is used to store the next state NS during the current cycle to be used as the state in the next cycle.

A canonical representation of the next-state transition function simplifies the problem of comparing the two FSMs. Let $f_s$ and $f_i$ be the transition functions corresponding to the specification and implementation respectively. Suppose $f_s$ and $f_i$ are both in canonical (FSM) form. Then, $f_s(I,S)=f_i(I,S)$ for all possible inputs I and current states S, the canonical form of $f_s$ will be identical to the canonical form of $f_i$.

Conversion of a logic program to a canonical FSM form involves a number of steps which eliminate the structure implicit in the notation. The first step removes some of the clausal structure by merging clauses of a procedure definition into a single clause known as the completed form. Suppose the definition of an n-ary predicate symbol p is composed of m clauses:

$$p(t_{11}, \ldots, t_{1n}) \leftarrow B_1$$
$$p(t_{21}, \ldots, t_{2n}) \leftarrow B_2$$
$$\vdots$$
$$p(t_{m1}, \ldots, t_{mn}) \leftarrow B_m$$

The completed form of p is constructed by first creating n new variables $V_i, i=1 \ldots n$. With these variables and the terms $t_{ji}, i=1 \ldots m$, where the $t_{ji}$ are the n parameters of the m clauses above, new atomic formulae $V_i = t_{ji}$ are created for each $i=1 \ldots n$ $j=1 \ldots m$, where $=$ is the term equality relation such that the atomic formula $t_1=t_2$ is true if and only if $t_1$ matches $t_2$. With these atomic formulae and the bodies $B_j$, $j=1 \ldots m$, of the above clauses, the completed form of p is formed:

$$p(V_1, \ldots, V_n) \leftarrow ((V_1 = t_{11}, \ldots, V_n = t_{1n}, B_1) \vee$$
$$(V_1 = t_{11}, \ldots, V_n = t_{1n}, B_2) \vee$$
$$\vdots$$
$$(V_1 = t_{m1}, \ldots, V_n = t_{mn}, B_m))$$

Figure 8:
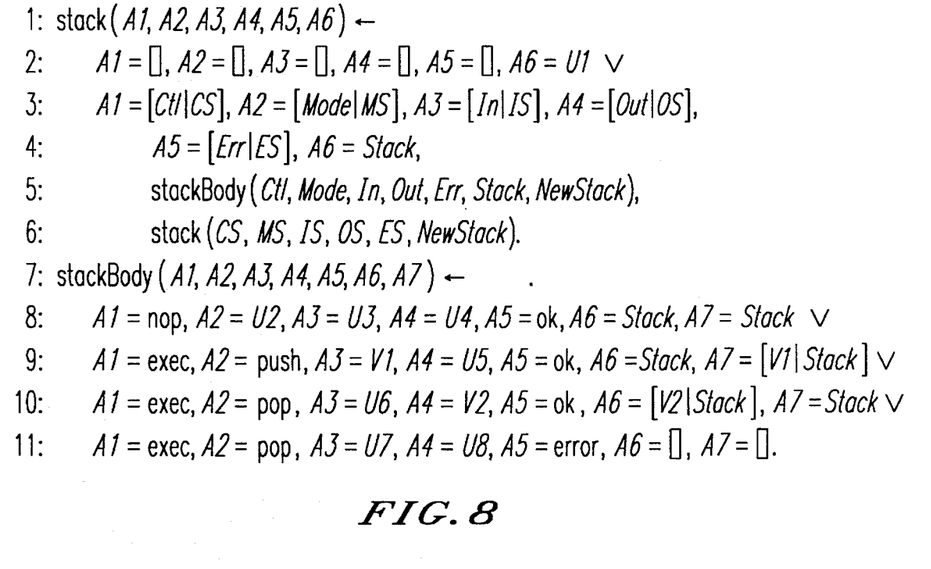
FIG. 8 shows the completed form of the clauses of the program shown in FIG. 2.

The procedure is repeated until all procedure definitions are in completed form. FIG. 8 shows the completed form of the stack program of FIG. 2.

2-2-3. Flattening of Procedure Call Hierarchy

The next step consists of flattening the procedure call hierarchy, whereby calls are replaced by procedure bodies. This replacement, known as unfolding, consists of replacing variables of the procedure bodies by arguments to the call, and suitably renaming local variables so that they remain distinct.

Recursive calls present a problem to the flattening procedure. A recursive procedure is a procedure which contains a call that, during execution, ultimately results in call back to the procedure. For example, the procedure stack of FIG. 2 contains a call on line five which is a (direct) recursive call to the procedure in which it appears.

Continuously unfolding calls to non-recursive procedure eventually leads to a program in which no more calls to non-recursive procedures remain. For calls to recursive procedures, a procedure similar to the one described below is used to determine which recursive calls lead to termination if continuously unfolded by the procedure bodies. (Reference: M. Bruynooghe et Danny De Schreye and Bern Martens. A general criterion for avoiding infinite unfolding during partial evaluation. New Generation Computing, pp.

47–79, November 1992). This procedure detects which recursive calls always result in subsequent recursive calls that are "smaller" by some metric, thereby ultimately resulting in a call of size zero, in other words a call that does not produce another call to a recursive procedure.

Figure 9:
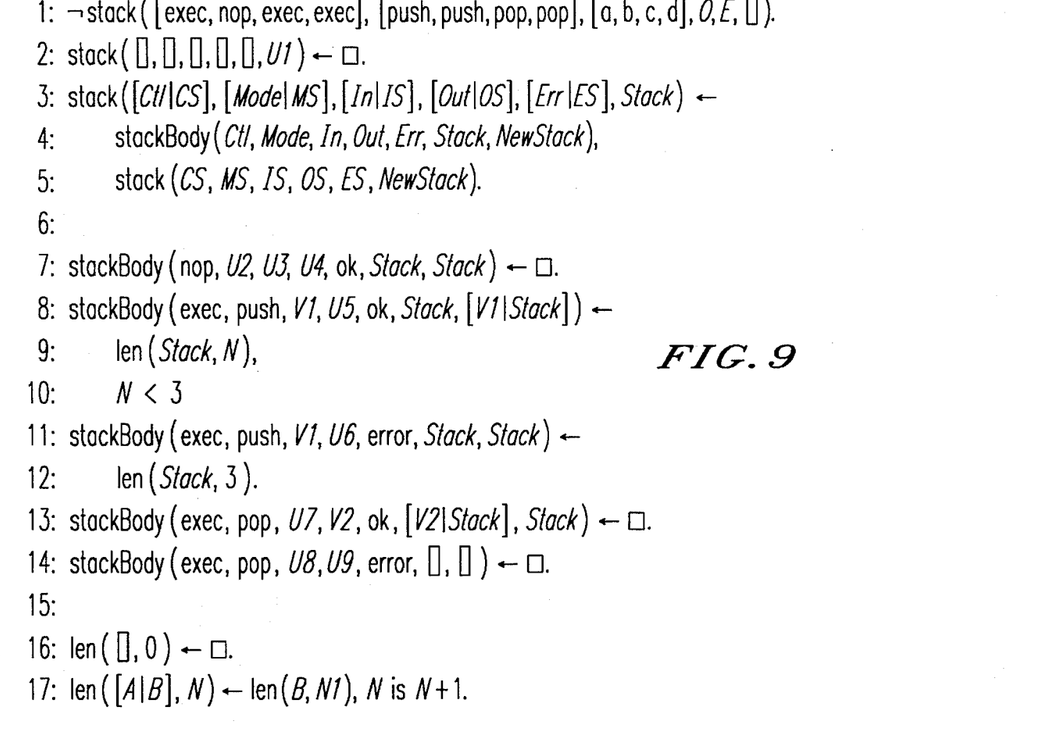
FIG. 9 shows a variation of the stack program in which the depth of the stack is limited to three.

FIG. 9 shows a variation of the stack program in which a limit of three has been placed on the number of elements that can be pushed onto the stack. In the expected mode of execution, the relation len is intended to compute the length of the list given in the first argument, and return it in the second argument. The relations denoted by < and "is", which are written in infix notation, are assumed to be built-in to the system. The relation denoted by < represents the relation that is true when the two arguments are integers and the first is strictly smaller than the second. In the expected mode of execution, the relation "is" evaluates the right hand expression, and places the result in the variable to the left of the "is" predicate symbol.

Figure 10:
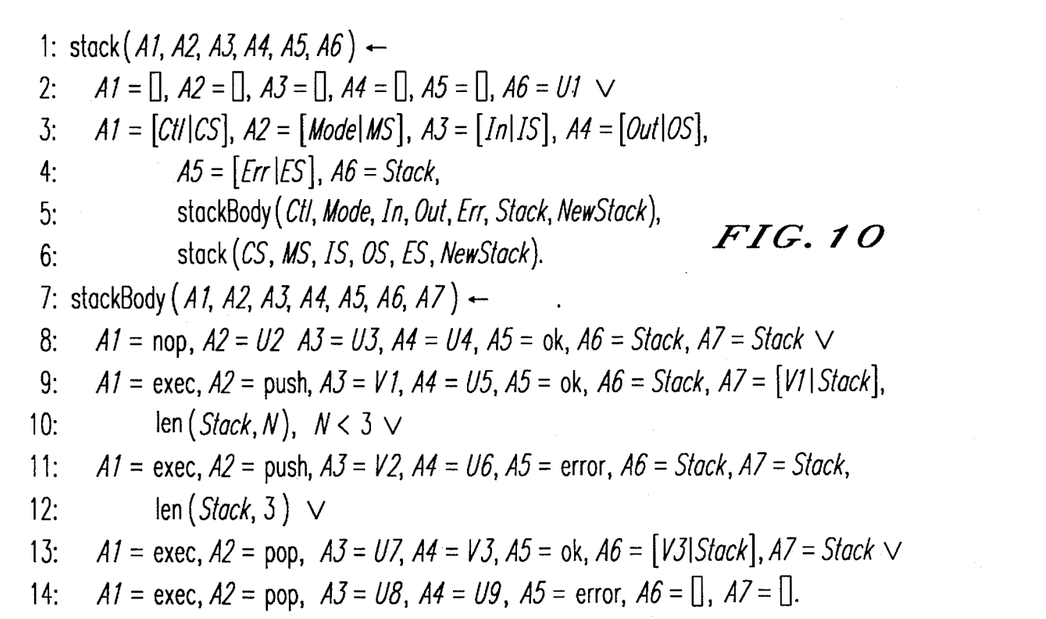
FIG. 10 shows the completed form of the clauses of the program shown in FIG. 9.
Figure 11:
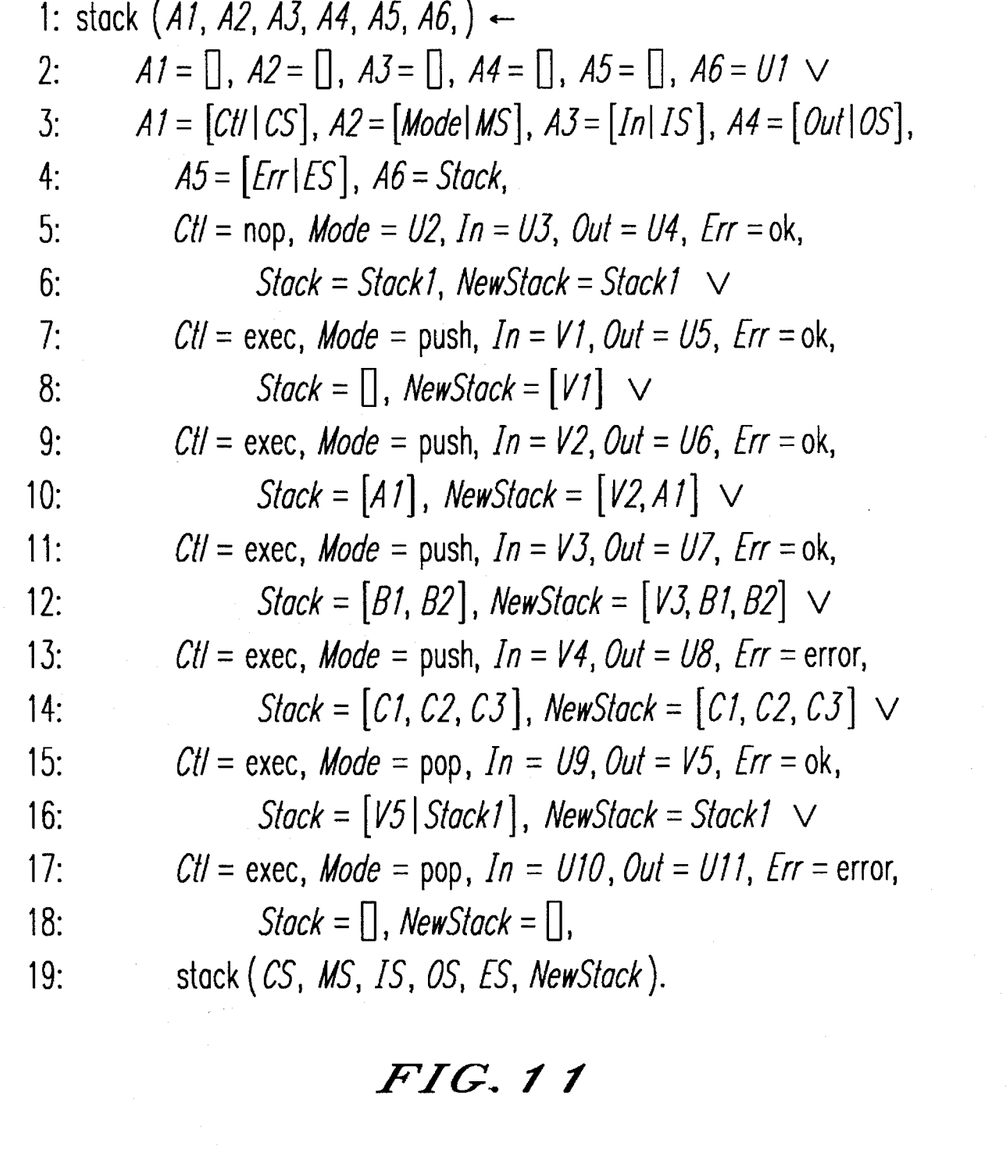
FIG. 11 shows the result of flattening the completed form shown in FIG. 10.

FIG. 10 shows the completed form of the stack program shown in FIG. 9. FIG. 11 shows the flattened stack program. The calls to the recursive procedure "len" have been expanded because the second argument always has an upper bound of 3.

2-2-4. Mapping into FSMs

After flattening the program, only calls to recursive procedures remain. The recursive procedures are mapped into FSMs by mapping the bodies of recursive procedures minus the recursive call to iterative expressions of the form:

<Formula 11>
for I=0 . . . n
$R=f(I_i,S_i)$
$O=l(R)$
$S_{i+1}=r(R)$ where R is the state register, and functions l and r return the left and right elements of a pair respectively. The iterative form shown in formula 11 is equivalent to a recursive procedure (say, fsm) that generates a stream of output values from a stream of input values, along with an initial state:

<Formula 12>
$fsm([I_i \rightarrow IS], [O_i \rightarrow OS], R) \leftarrow f(I_i, R_i, V), V=pair(O_i, R_{i+1}), fsm(IS, OS, R_{i+1})$.

where the transition function is written in predicate notation, and the left and right selector functions l and r are accomplished via matching.

In the predicate notation of the FSM description, the input and output lists represent a sequence of values processed in the temporal domain in a manner similar to lazy evaluation, and therefore memory is not needed to store the entire lists. The third argument of fsm does however imply a storage register in order to avoid race conditions when the list positions of the input and output lists move forward, and the current state $R_i$ is over-written by the next state $R_{i+1}$.

The recursive calls of the flattened programs are analyzed to find patterns equivalent in structure to the fsm procedure described above. The entry and exit types of recursive calls are analyzed to determine which arguments denote sequences types that can be processed in the temporal domain. Sequence types are of the form:

<Formula 13>

$\tau=\{f_0, f_1(\tau_e,\tau)\}$ where τ is some type variable denoting the sequence type $\tau_e$ is a type variable denoting the element type of the sequence, $f_0$ is an arbitrary constant, and $f_1$ is an arbitrary binary function symbol. For example, the list notation:

<Formula 14>

$\tau=\{[], [\tau_e|\tau]\}$ is often used as a sequence type.

The arguments of the recursive procedure are further partitioned into input and output lists. Arguments are input lists if the entry type (e.g. FIG. 5) of the argument in the call is a sequence type that contains no Φ types (i.e. it is a ground type). Arguments are output lists if the entry type is equivalent to either the type Φ, or it is equivalent to a sequence type in which the element type $\tau_e$ is the type Φ, and the exit type is a ground sequence type. Those arguments which are not input or output lists are classified as state registers. Recursive procedure that have one or more input lists, and one or more output lists correspond directly with the FSM form depicted by the recursive procedure fsm shown above.

Some limitations are present in the preferred embodiment, since there must be a process for converting logic programs to a FSM form. Programs which contain recursive procedures which cannot be mapped to the FSM form depicted by fsm, are not treated. Further restrictions will be imposed on the representation of the state registers, since the machines must be finite state, and therefore, the representation of the state must be finite. Some limitations are to be expected, because the general problem of comparing arbitrary logic programs is undecidable.

Logic programs that satisfy the limitations consist of an interconnection of one or more FSMs. FIG. 10 satisfies the limitations since it maps directly into the form depicted by fsm. For programs consisting of an interconnection of smaller FSMs, a single large FSM can be constructed by taking the overall state representation to be the concatenation of the state representations of all the smaller FSMs, and the transition function also becomes a concatenation of the smaller functions. The result is a single recursive clause having input list arguments (i.e. I), output list arguments (i.e. O), and a single state register argument( i.e. R).

The transition function is a new procedure, in the form of "H←B", extracted from the single recursive clause. The body "B" of this transition function is obtained by removing the recursive call from the body of the single recursive clause, as in list related processing. The arguments of H are input and output elements selected from the sequence types, along with the state and next state arguments.

The argument positions of the inputs and outputs are carefully maintained such they correspond with the positions of the lists from which the elements were selected. The state and next state arguments are always the last two argument positions of the transition function. The completed form is applied to ensure that the procedure representing the transition function has only variables in the atomic formula to the left of the←connective.

Figure 12:
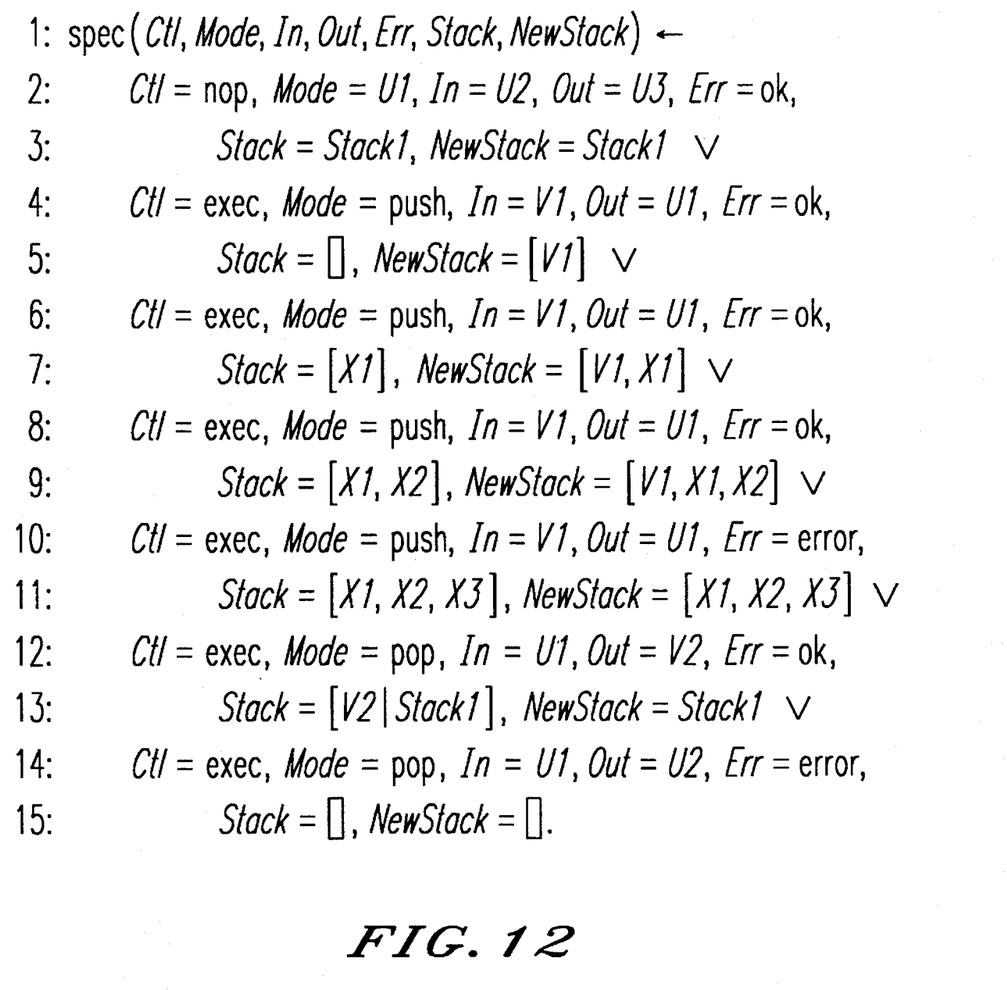
FIG. 12 is the transition function extracted from the flattened program shown in FIG. 11.

FIG. 12 shows the transition function extracted from FIG. 10. The predicate symbol spec is used to indicate that the function is the transition function of the specification FSM.

2-2-5. Reordering of the Body

Reordering the body of the transition function produces an expression, called a decision tree, which is close to being canonical:

2-2-5-1.

Reorder each atomic formula t=V to the atomic formula V=t, where V is an input, output, state, or next state variable.

2-2-5-2.

Remove atomic formula of the form $V_{in}=V_1$ where $V_1$ does not occur elsewhere within the conjunction, and $V_{in}$ is an input variable. This latter step removes don't care comparisons.

2-2-5-3.

Partition the atomic formulae into comparisons and assignments. Comparisons are atomic formulae of the form $V_{in}=t$ where $V_{in}$ is an input variable or the current state variable, and t is an arbitrary term. Assignments are atomic formulae of the form $V=t$, where the entry type of V is $\Phi$. 2-2-5-4.

Figure 13:
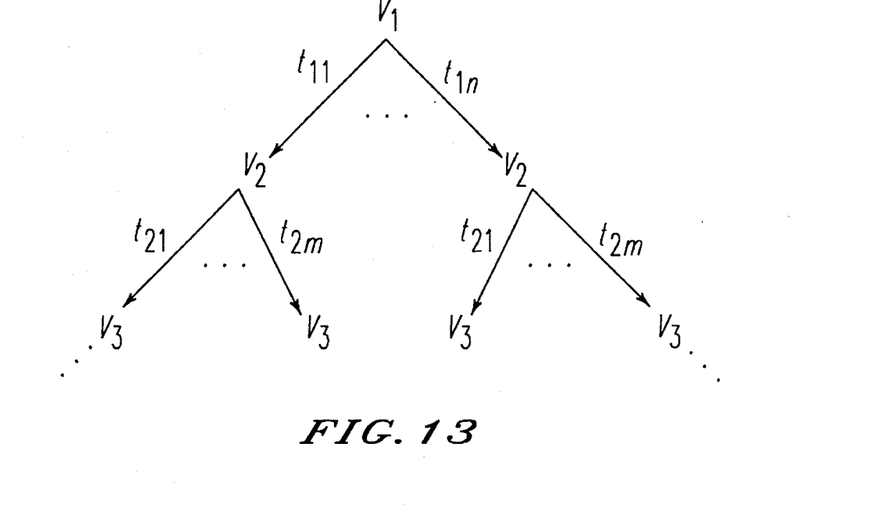
FIG. 13 shows the general structure of a decision tree.

Let the variables $V_1, V_2, \ldots, V_{l-1}$ be the input variables in the order they appear as arguments to the transition function, and let $V_1$ be the current state variable. Let $\{V_i=t_{i1}, \ldots, V_i=t_{in}\}$ be the set of comparisons common in $V_i$. The body of the transition function is rearranged such that the expression is in the form shown in FIG. 13. In FIG. 13, nodes represent the input and state variables $V_i$, i=1...1, and the edges from node $V_i$ labeled by the terms $t_{i1}, \ldots, t_{in}$ represent the alternative comparisons $V_i=t_{ij}$, j=1...n, as connected by the V (OR) connective. The leaves of the tree are the expressions not involving comparisons with input and state variables rearranged such that assignments to output variables are ordered and placed first, followed by expressions assigning values to the next state variable.

Figure 14:
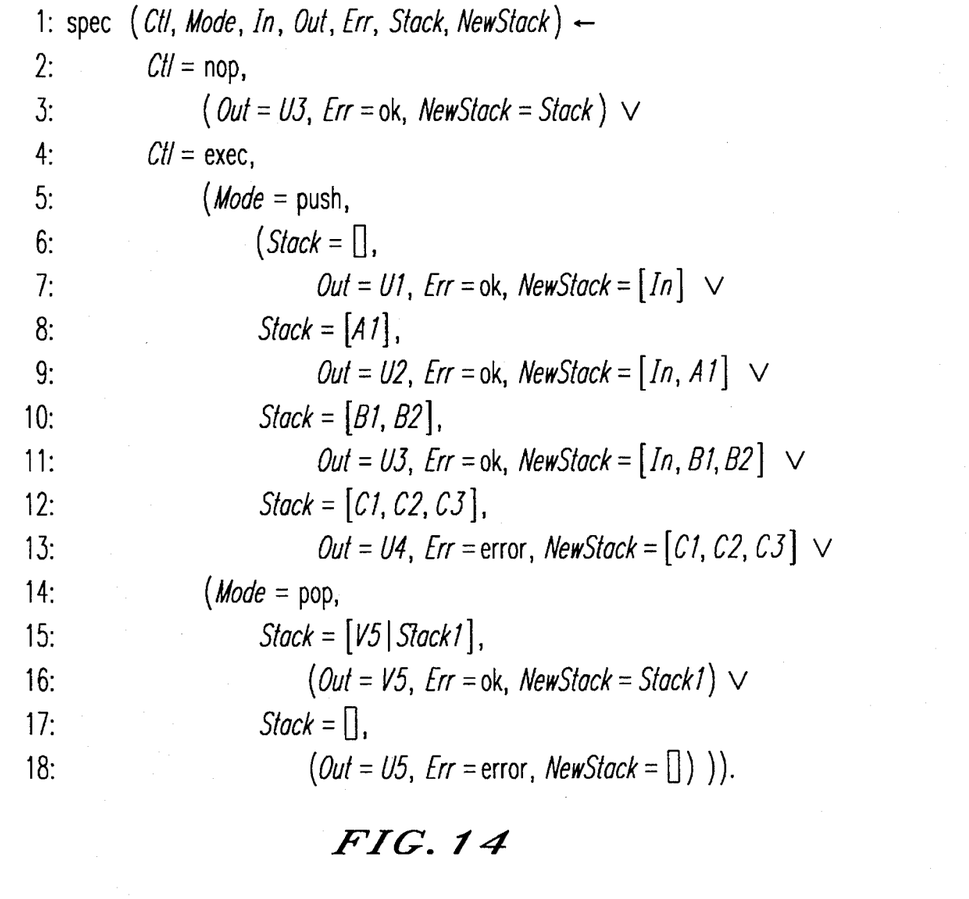
FIG. 14 shows the transition function of FIG. 12 in which expressions have been ordered.

The order of variables $V_1, V_2, \ldots, V_{l-1}$ is fixed. Based on this order, the set of comparisons $\{V_i=T_{i1}, \ldots, V_i=T_{in}\}$ for each Vi, Vi=1...1, can be reordered, resulting in an expression which is almost canonical. This is because, if equivalent FSMs are given the same input, they are associated with the comparisons in the same order. FIG. 14 shows the transition function after reordering the body into a decision tree.

Figure 15:
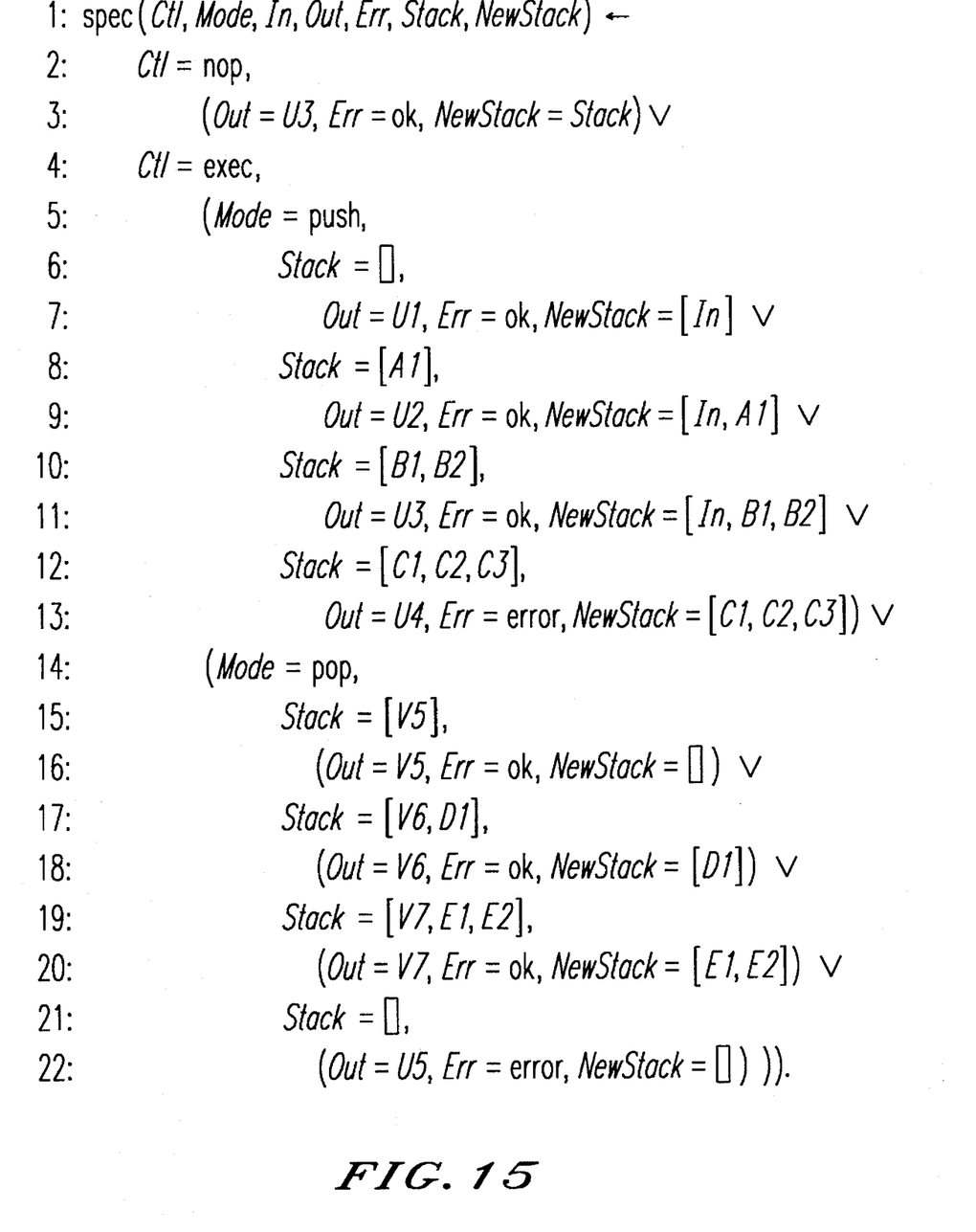
FIG. 15 shows the transition function of FIG. 14 in which the state space has been flattened.

Let $V_s$ be the current state variable. Comparisons of the form $V_s=t$, where t matches more than one term within the state type, is flattened using a process analogous to the flattening of clauses, such that every term occurring in the transition function represents a unique term. FIG. 15 shows the result of flattening of the stack state.

2-2-6. Encoding of the States

Figure 16:
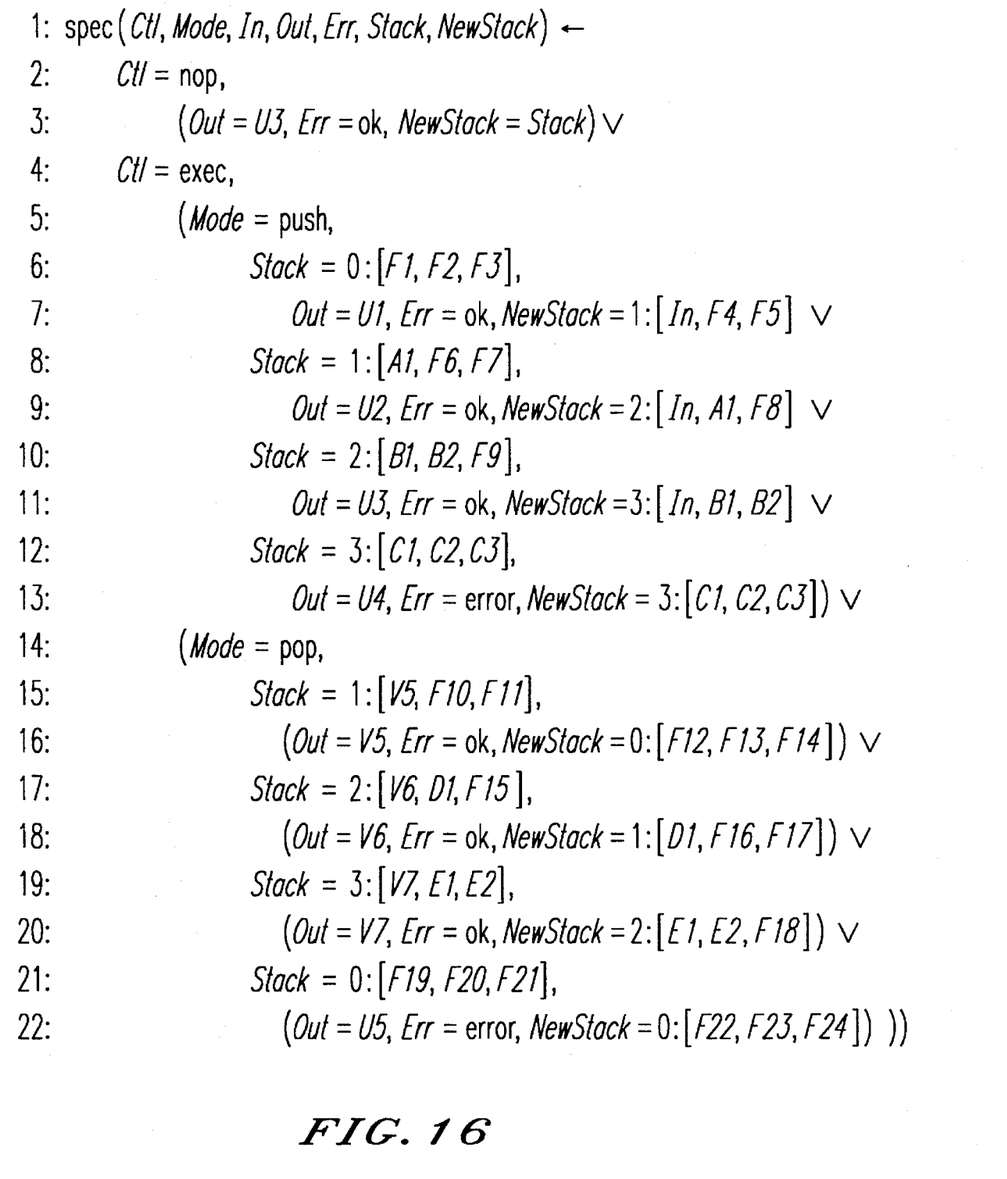
FIG. 16 shows the transition function of FIG. 15 in which the representation of the state space has been converted into constant/variable pairs.

Enumeration of the states of the FSM is accomplished by first converting each term t of the state occurring in the transition function into a pair i: $(V_1, \ldots, V_n)$, where i is a unique integer, and $(V_1, \ldots, V_n)$ is a vector of polymorphism variables. For a term t containing variables $V_1, \ldots, V_n$ that each have entry and exit type $\Phi$, the variables $V_1, \ldots, V_n$ represent polymorphic parameters of the FSM. The vector $<V_1, \ldots, V_n>$ is built by listing the variables of t in some predetermined traversal order (typically depth-first, left to right traversal). The vector is padded to the right with unique variables such that all vectors are of equal length. The integer i of the pair is assigned by enumerating the terms of the state type that are unique modulo renaming of the polymorphism variables, and assigning a unique integer to each term. FIG. 16 shows the final canonical form of the transition function of the stack example. If the above conversion fails, the user is informed about the failure.

2-3. Comparison of FSMs

The first and second FSMs thus converted are sent to the comparison section 6 where verification is done to check that two FSMs are equivalent. To verify that two FSMs are equivalent, an equivalence between the encodings of the inputs, outputs and state representations of the two machines must be found such that the transition functions are equal.

Let $E_i, E_o$, and $E_s$ be the equivalences between the input, output, and state representations of the two machines respectively. The equivalence $E_i$ is a set of pairs $(t_1,t_2)$, where $t_1$ is a term that is a member of the input type for the first FSM, and $t_2$ is a term that is a member of the input type for the second FSM. Similarly for the equivalences $E_o$ and $E_s$.

In the preferred embodiment, the equivalences $E_i$ and $E_o$ can either be supplied explicitly by the user in order to reduce the run-time, or they may be computed along with the equivalences $E_s$.

Let $f_1$ and $f_2$ be the transition functions of FSM 1, and FSM 2 respectively. Let $f'_2$ be the function $f_2$ in which each input, output, and state term is replaced by the associated element of the pair in $E_i$, $E_o$, and $E_s$ respectively. The two finite state machines are equal if $f_1=f'_2$.

2-3-1. Constraint Solver

A constraint solver is used to find equivalences $E_i, E_o$, and $E_s$ that satisfy $f_1=f'_2$. Constraints consist of a conjunction of inequalities, along with a disjunction of conjunctions of equalities over constraint variables.

Unique constraint variables are created for each input, output, and state term of each FSM. The inequalities specify that within a single machine, no two input terms are equal, no two output terms are equal, and no two state values are equal:

<Formula 15>

$i_{10} \neq \ldots \neq i_{1p} \wedge o_{10} \neq \ldots \neq o_{1q} \wedge s_{10} \neq \ldots \neq s_{1r} \wedge i_{20} \neq \ldots \neq i_{2p} \wedge o_{20} \neq \ldots \neq o_{2q} \wedge s_{20} \neq \ldots \neq s_{2r}$ where each $i_{1j}$, j=0...p, $o_{1k}$, k=0...q, and $s_{1l}$, l=0...r, is a constraint variable from FSM 1 representing a member of the input type, output type, and state type respectively. Similar rules are generated for $i_{2j}$, $o_{2k}$, and $s_{2l}$ of FSM 2.

The remaining disjunction of conjunctions (i.e. sum of products) of equalities is generated by finding all possible permutations $f_1^1, f_1^2, \ldots, f_1^n$ of $f_1$. A permutation of $f_1$ is found by exchanging expressions in a disjunction as follows:

<Formula 16>

$\ldots \vee e_1 \vee \ldots \vee e_2 \vee \ldots$ is permuted into

<Formula 17>

$\ldots \vee e_2 \vee \ldots \vee e_1 \vee \ldots$

Each pair $f_1^i$ and $f_2$ are simultaneously traversed to determine whether they are structurally identical (i.e. the decision trees are structurally the same). If they are structurally identical, a conjunction is formed between the equalities $V_1=V_2$, where $V_1$ is the constraint variable for form $t_1$, $V_2$ is the constraint variable $t_2$, and $t_1$ is an input (output, state) term from FSM 1 which has been matched with input (output, state, resp.) term $t_2$ of FSM 2 during the traversal. A disjunction is formed from each of the conjunctions of the structurally identical pairs.

Figure 17:
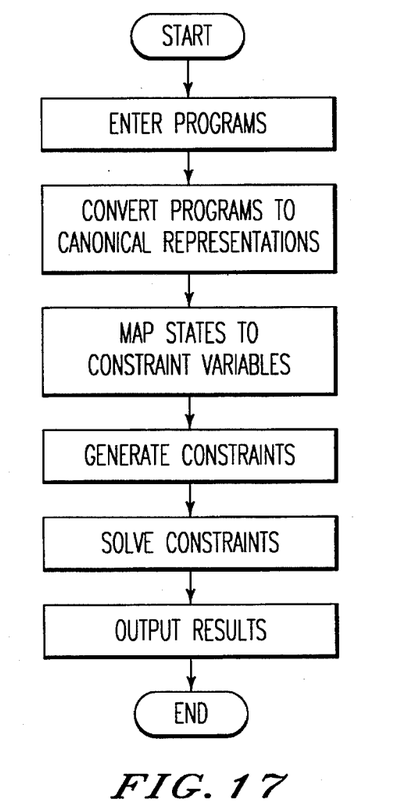
FIG. 17 is the general flowchart of the logic program comparison method steps used in the preferred embodiment of this invention.

Based on the constraints thus generated, the equality between the first FSM and the second FSM is determined, and the result is displayed on the display unit 2 via the output section 7. FIG. 17 is the general flowchart of the logic program comparison procedure.

3. Effect of the Embodiment

As shown in the preferred embodiment, the equalities need not be strict equalities but need only satisfy a given relation, making it possible to verify parameterized logic programs. Canonical FSMs suitable for verification are obtained in this preferred embodiment, making comparison between two FSMs easy. The comparison contents are restricted by generic queries in this preferred embodiment, making comparison more efficient. And, the conversion section 5 determines the data type by applying the static analysis to each program, thus eliminating the need for the user to determine the data type based on the program.

In this preferred embodiment, the comparison section 6 uses a constraint solver to perform the comparison, allowing FSMs, each having its own internal representation, to be compared. This eliminates the need for the user to find the correspondence between the state representations of the FSMs to be compared. In this preferred embodiment, it is also possible to compare FSMs having the states represented by parametric polymorphism variables (i.e., FSMs containing states represented parametrically (using parameters)).

The invention takes advantage of patterns in the state space, thereby making possible the verification of a wider class of machines, as well as improved the overall speed of the verification. In the preferred embodiment, polymorphism provided a powerful mechanism for allowing the comparison of generic machines, which was realized by treating each instance of polymorphism as a single pattern in the state space.

4. Other Embodiments

It should be understood that the invention is not limited to the embodiment described above but that it covers other embodiments. For example, data types, which are determined through static analysis in the above embodiment, may be determined through other analysis methods or manual operation. The information specified by generic queries may be entered through manual operation or other analysis methods. The program logic comparator, though implemented on a computer in the above embodiment, may be implemented, in whole or part, by an electronic circuit.

5. Effect of the Invention

The present invention provides a logic program comparison method which makes it possible to do verification by comparing parameterized logic programs and which increases the efficiency of the verification.

What is claimed is:

1. A computer-based logic program verification method comprising:

receiving two logic programs, each having procedures with program variables, each of said program variables being of a corresponding data type;

converting said logic programs to a first and second finite state machine description respectively, each having internal states, input values and output values, comprising, determining the data types of variables of said logic programs, converting said programs to a completed form having expressions in disjunctive form, expanding procedure calls within said programs into corresponding procedure bodies, translating said programs into corresponding transition functions composed of transition function expressions;

determining from said transition functions whether there exists an equivalence between internal states, between input values, and between output values of said first and second finite state machine descriptions, and determining whether said finite state machine descriptions produce respective output values deemed equal for all respective inputs deemed equal and for all respective states deemed equal; and outputting the result of said comparing step.

2. A computer-based logic program verification method according to claim 1, wherein said receiving step receives generic queries as part of said programs and wherein said converting step performs said converting based on said generic queries.

3. A computer-based logic program verification method according to claim 1, wherein said converting step determines said data types by applying static analysis to said programs.

4. A computer-based logic program verification method according to claim 1, wherein said comparing step uses a constraint solving technique comprising the steps of:

associating a unique constraint variable with each program variable denoting an input, output, or state variable;

grouping each constraint variable of a particular data type from said first logic program with every other constraint variable of a corresponding data type from said first logic program to form pairs;

grouping each constraint variable of a particular data type from said second logic program with every other constraint variable of a corresponding data type from said second logic program to form pairs;

generating a conjunction of inequalities between each pair of said constraint variables;

generating, for all possible reorderings of the expressions in disjunctive form equalities between constraint variables occurring in respective positions;

taking the conjunction of inequalities and said generated equalities as constraints to a new expression;

solving the new expression using the constraints.

5. A computer-based logic program verification method according to claim 1, wherein said logic programs are described by definite clauses that are a subset of predicate logic, and wherein a definite clause is restricted to one of a query, a rule and a fact.

6. A computer-based logic program verification method according to claim 1, wherein recursive procedures having recursive procedure bodies are mapped into FSMs by mapping the recursive procedure bodies into corresponding iterative expressions, thus removing corresponding recursive calls.

7. A logic program verification method according to claim 1, wherein said converting step further comprises:

permuting the transition function expressions to group together variables with common values, and replacing each variable by a unique code;

permuting the transition function expressions to group together variables with common values;

converting transition function expressions where one of said internal states takes on multiple values into multiple expressions wherein said one of said internal states takes on a different corresponding value in each of said multiple expressions;

encoding each transition function expression having a unique internal state with a unique code.

* * * * *